(12) United States Patent
Nakashima et al.

(10) Patent No.: US 8,619,826 B2
(45) Date of Patent: Dec. 31, 2013

(54) LASER DIODE

(75) Inventors: Makoto Nakashima, Miyagi (JP); Takahiro Yokoyama, Miyagi (JP); Sachio Karino, Miyagi (JP); Eiji Takase, Miyagi (JP); Yuta Yoshida, Miyagi (JP)

(73) Assignee: Sony Corporation, Tokyo (JP)

( * ) Notice: Subject to any disclaimer, the term of this patent is extended or adjusted under 35 U.S.C. 154(b) by 394 days.

(21) Appl. No.: 12/797,111

(22) Filed: Jun. 9, 2010

(65) Prior Publication Data

US 2010/0329295 A1  Dec. 30, 2010

(30) Foreign Application Priority Data

Jun. 30, 2009  (JP) .................................. 2009-155737

(51) Int. Cl.
*H01S 3/00* (2006.01)
(52) U.S. Cl.
USPC .............. 372/38.05; 372/29.013; 372/46.012; 372/87; 372/50.122
(58) Field of Classification Search
USPC .......... 372/38.05, 46.012, 87, 50.122, 29.013
See application file for complete search history.

(56) References Cited

U.S. PATENT DOCUMENTS

| | | | |
|---|---|---|---|
| 5,513,200 A * | 4/1996 | Paoli ........................ | 372/50.122 |
| 6,444,998 B1 | 9/2002 | Taniguchi et al. | |
| 6,630,366 B2 * | 10/2003 | Taniguchi et al. .............. | 438/34 |

FOREIGN PATENT DOCUMENTS

| | | |
|---|---|---|
| JP | H05-43565 | 6/1993 |
| JP | H11-233877 | 8/1993 |
| JP | 03-092881 | 11/1993 |
| JP | H11-330630 | 11/1999 |
| JP | 2000-269601 | 9/2000 |
| JP | 2002-359437 | 12/2002 |
| JP | 2007-184556 | 7/2007 |

OTHER PUBLICATIONS

Japanese Office Action from related Japanese patent application No. 2009-155737 dated Mar. 13, 2013.
Japanese Office Action issued in connection with related Japanese Patent Application No. 2009-155737 dated May 29, 2013.

* cited by examiner

*Primary Examiner* — Tod T Van Roy
(74) *Attorney, Agent, or Firm* — Dentons US LLP

(57) ABSTRACT

A laser diode includes: a plurality of strip-shaped laser structures arranged in parallel with each other, and including a lower cladding layer, an active layer, and an upper cladding layer in this order; a plurality of strip-shaped upper electrodes singly formed on a top face of the respective laser structures, and being electrically connected to the upper cladding layer; a plurality of wiring layers being at least singly and electrically connected to one of the respective upper electrodes; and a plurality of pad electrodes formed in a region different from that of the plurality of laser structures, and being electrically connected to one of the respective upper electrodes with the wiring layer in between. The respective wiring layers have an end in a region different from a region where the respective wiring layers are contacted with the upper electrode.

7 Claims, 9 Drawing Sheets

LASER DIODE

BACKGROUND OF THE INVENTION

1. Field of the Invention

The present invention relates to a laser diode with which each emitter is able to be independently driven.

2. Description of the Related Art

In a laser diode, for the purpose of independently driving each emitter, a separation groove that electrically separates adjacent emitters is provided between the adjacent emitters. The width of the separation groove varies according to the laser type. In the case of a narrow pitch type laser having a beam pitch of about several tens of μm, the width of the separation groove is only about several μm. Thus, in such a case, it is significantly difficult to provide a wiring layer that connects a stripe electrode on the emitter (laser structure) with both sides surrounded by separation grooves and a pad electrode formed in a location apart from the laser structure in a narrow separation groove. Thus, for example, as described in Japanese Unexamined Patent Application Publication No. 2000-269601, it is general that an insulating material is buried in the separation groove, and the foregoing wiring layer is provided on the insulating material.

SUMMARY OF THE INVENTION

However, in the laser described in the foregoing Japanese Unexamined Patent Application Publication No. 2000-269601, there is a disadvantage that a polarization direction of light emitted from the central laser structure out of many arranged laser structures is different from a polarization direction of light emitted from an end laser structure. Further, in a laser in which only a single laser structure is provided, there is a disadvantage that a polarization direction of light emitted from the single laser structure is different from a desired direction.

In view of the foregoing, in the invention, it is desirable to provide a laser diode with which polarization directions of light emitted from a plurality of laser structures are able to be aligned, and a polarization direction of light emitted from a single laser structure is able to be directed in a desired direction.

According to an embodiment of the invention, there is provided a first laser diode including: a plurality of strip-shaped laser structures arranged in parallel with each other, and including a lower cladding layer, an active layer, and an upper cladding layer in this order; a plurality of strip-shaped upper electrodes singly formed on a top face of the respective laser structures, and being electrically connected to the upper cladding layer; a plurality of wiring layers being at least singly and electrically connected to one of the respective upper electrodes; and a plurality of pad electrodes formed in a region different from that of the plurality of laser structures, and being electrically connected to one of the respective upper electrodes with the wiring layer in between. The respective wiring layers have an end in a region different from a region where the respective wiring layers are contacted with the upper electrode.

According to an embodiment of the invention, there is provided a second laser diode including: a strip-shaped laser structure including a lower cladding layer, an active layer, and an upper cladding layer in this order; a strip-shaped upper electrode formed on a top face of the laser structure, and being electrically connected to the upper cladding layer; a wiring layer being electrically connected to the upper electrode; and a pad electrode formed in a region different from that of the laser structure, and being electrically connected to the upper electrode with the wiring layer in between. The wiring layer has an end in a region different from a region where the wiring layer is contacted with the upper electrode.

In the first and the second laser diodes of the embodiment of the invention, the wiring layer has an end in a region different from a region where the wiring layer is contacted with the upper electrode. Thereby, compared to a case that a wiring layer has an end in a region where the wiring layer is contacted with an upper electrode, symmetry centering on a central axis of the laser structure of the shape in the region opposed to the top face of the laser structure in the wiring layer is high.

According to the first and the second laser diodes of the embodiment of the invention, symmetry centering on the central axis of the laser structure of the shape in the region opposed to the top face of the laser structure in the wiring layer is high. Thereby, it is possible to decrease change of polarization direction caused by asymmetry of the wiring layer. In the result, polarization directions of light emitted from the plurality of laser structures are able to be aligned, and a polarization direction of light emitted from a single emitter is able to be directed in a desired direction.

In particular, in the case where a groove is provided on both sides of a laser structure, the groove is not buried and in a state of an air gap, asymmetry of a wiring layer becomes a main factor of polarization direction change. Thus, in this case, by increasing symmetry of the wiring layer, polarization directions of light emitted from the plurality of laser structures are able to be aligned, and a polarization direction of light emitted from a single emitter is able to be directed in a desired direction easily.

Other and further objects, features and advantages of the invention will appear more fully from the following description.

DETAILED DESCRIPTION OF THE PREFERRED EMBODIMENT

An embodiment of the invention will be hereinafter described in detail with reference to the drawings. The description will be given in the following order:
1. Embodiment (FIGS. 1A, 1B, and 2)
Example that a plurality of ridges are formed
Example that each wiring layer strides over all the ridges
Example that a groove is not buried 2. Modified examples Example that an end of each wiring layer is formed in an end of a top face of a ridge (FIGS. 6A, 6B, 7A, and 7B)

Figure 6A:
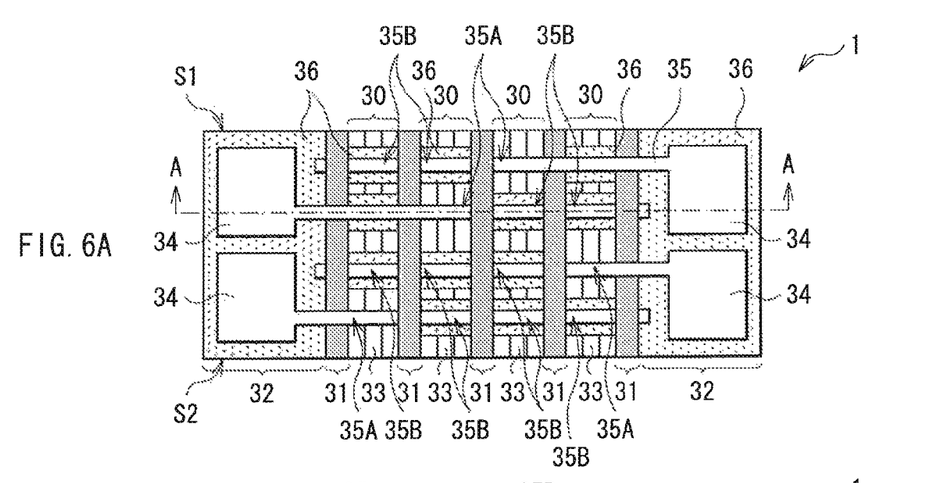
FIGS. 6A and 6B are a top view and a cross sectional view of a modified example of the laser diode of FIG. 1.
Figure 6B:
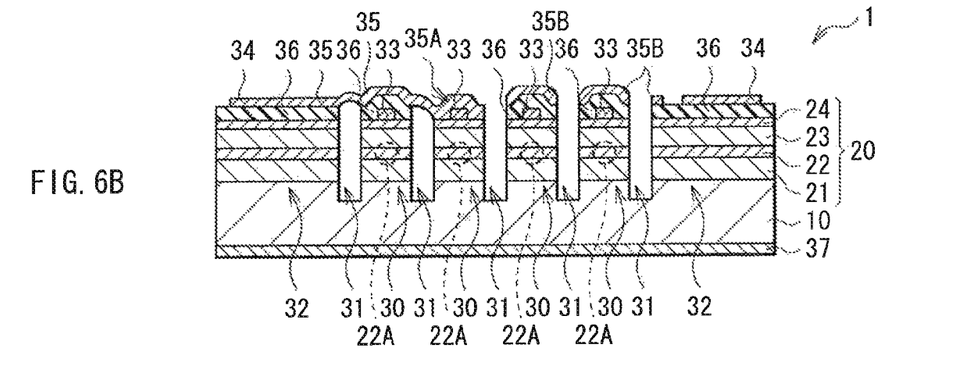
Figure 7A:
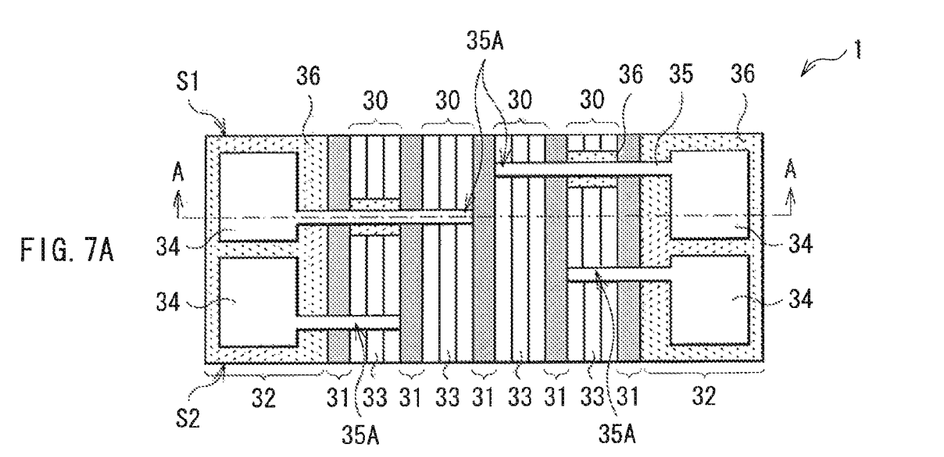
FIGS. 7A and 7B are a top view and a cross sectional view of another modified example of the laser diode of FIG. 1.
Figure 7B:
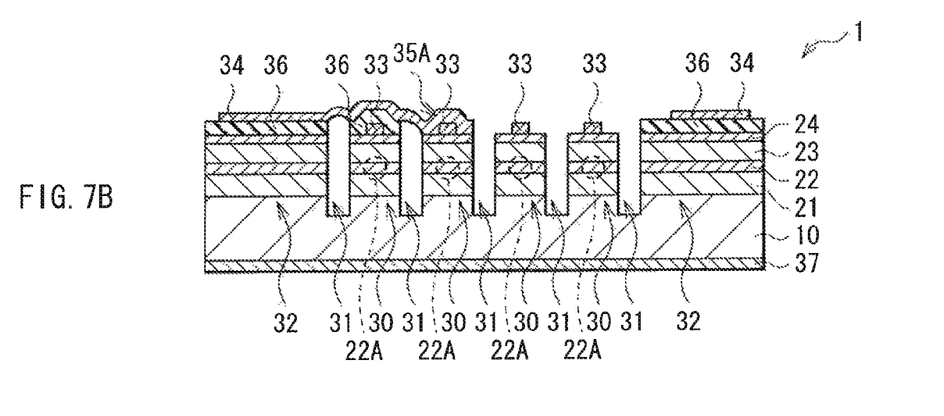

Example that a dummy wiring layer is formed on the ridge (FIGS. 6A and 6B)

Figure 8:
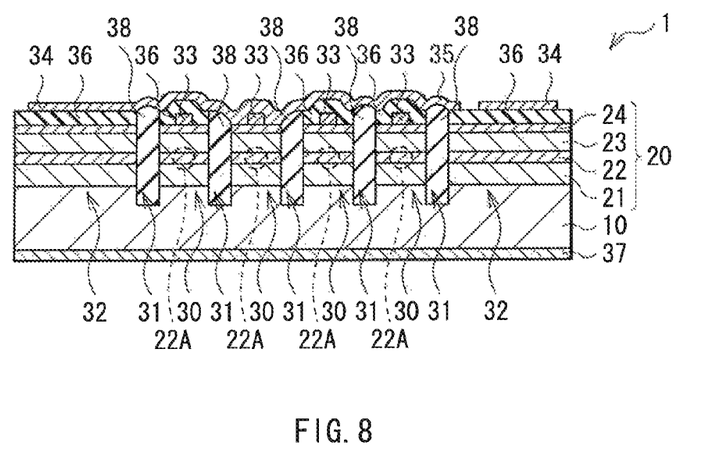
FIG. 8 is a cross sectional view of still another modified example of the laser diode of FIG. 1.

Example that a groove is buried (FIG. 8)

Figure 9:
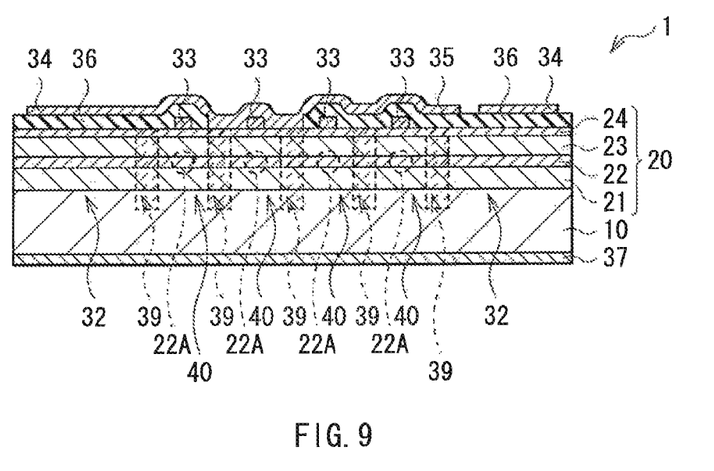
FIG. 9 is a cross sectional view of still another modified example of the laser diode of FIG. 1.

Example that a high resistance region is formed instead of the groove (FIG. 9)

Figure 10A:
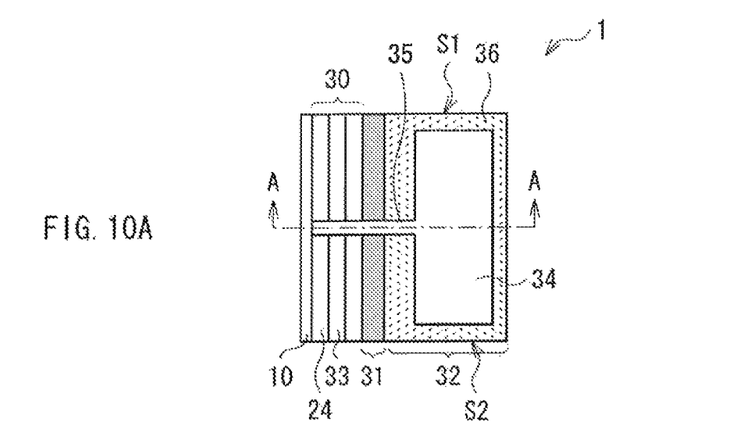
FIGS. 10A and 10B are a top view and a cross sectional view of still another modified example of the laser diode of FIG. 1.
Figure 10B:
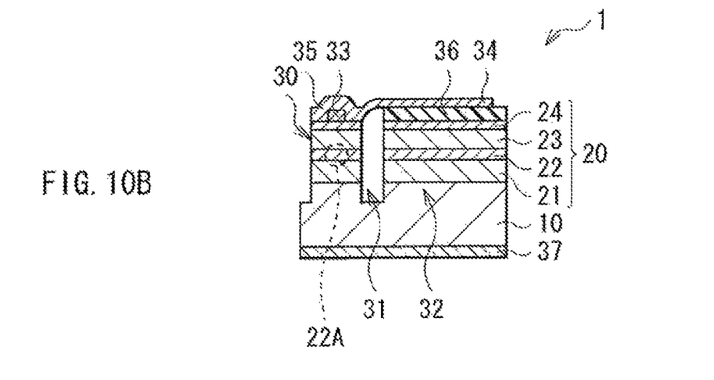

Example that only one ridge is formed (FIGS. 10A and 10B)

Embodiment

Figure 1A:
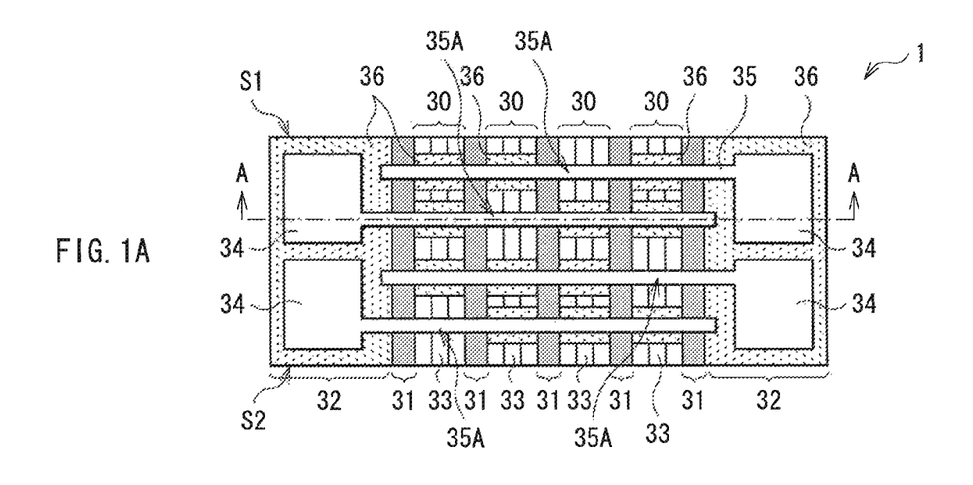
FIGS. 1A and 1B are a top view and a cross sectional view of a laser diode according to an embodiment of the invention.
Figure 1B:
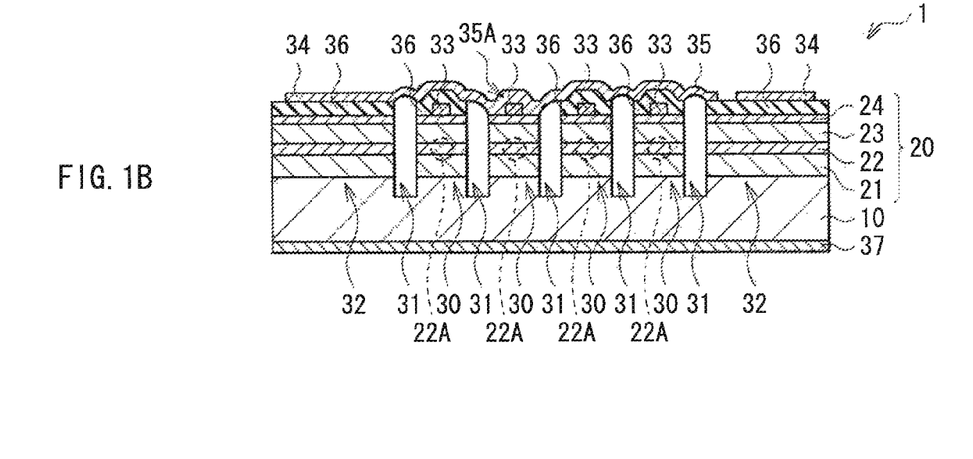

FIG. 1A illustrates an example of a top view structure of a laser diode 1 according to an embodiment of the invention. FIG. 1B illustrates an example of a cross sectional structure taken along line A-A of the laser diode 1 of FIG. 1A. The laser diode 1 of this embodiment is a multibeam laser diode including a plurality of striped emitters, and is an edge emitting laser diode in which laser beam is emitted from each end face of each emitter.

The laser diode 1 includes, for example, as illustrated in FIG. 1B, a semiconductor layer 20 including a lower cladding layer 21, an active layer 22, an upper cladding layer 23, and a contact layer 24 in this order from a substrate 10 side over the substrate 10. Thought not illustrated, the semiconductor layer 20 may be further provided with a layer other than the foregoing layers (for example, a buffer layer, a guide layer and the like). In the semiconductor layer 20, a plurality of strip-shaped ridges 30 (laser structure) are formed. The plurality of ridges 30 are arranged in parallel with each other, and function as an emitter independently outputting laser beam from a front end face S1. The number of the ridges 30 may be four as exemplified in FIGS. 1A and 1B, five or more, or three or less.

A strip-shaped groove 31 extending in extending direction of the ridge 30 is singly provided on both sides of the respective ridges 30. Out of the plurality of grooves 31, a groove 31 other than the grooves on both ends in the arrangement direction of the grooves 31 is sandwiched between two adjacent ridges 30. The grooves 31 on both ends in the arrangement direction of the grooves 31 are provided, for example, between the ridge 30 and a strip-shaped base 32 provided in a region other than that of the ridge 30 in the semiconductor layer 20. The height of the base 32 is preferably equal to the height of the ridge 30, but may be lower than the height of the ridge 30. For example, though not illustrated, the top face of the base 32 may be arranged in the same plane as that of the bottom face of the groove 31.

The respective grooves 31 have, for example a depth reaching the upper portion of the substrate 10, and spatially separate the respective ridges 30. For example, though not illustrated, the depth of the respective grooves 31 may have a depth not reaching the substrate 10. In this case, however, the respective grooves 31 preferably have a depth with which electric cross talk is not generated between adjacent ridges 30 (for example, a depth reaching the lower cladding layer 21).

The width of the groove 31 (width in a direction orthogonal to the extending direction of the groove 31) is smaller than the width of the ridge 30 (width in a direction orthogonal to the extending direction (resonator direction) of the ridge 30). For example, when the width of the ridge 30 is about several tens of μm (for example, 30 μm), the width of the groove 31 is about several μm (for example, 3 82 m).

In the respective ridges 30, a pair of a front end face S1 and a rear end face S2 sandwiching the ridge 30 from the extending direction of the ridge 30 is formed. The front end face S1 and the rear end face S2 structure a resonator. The pair of the front end face S1 and the rear end face S2 is formed by, for example, cleavage, and is arranged oppositely to each other with a given gap in between. Further, a low reflective film (not illustrated) is formed on the front end face S1, and a high reflective film (not illustrated) is formed on the rear end face S2.

Figure 3A:
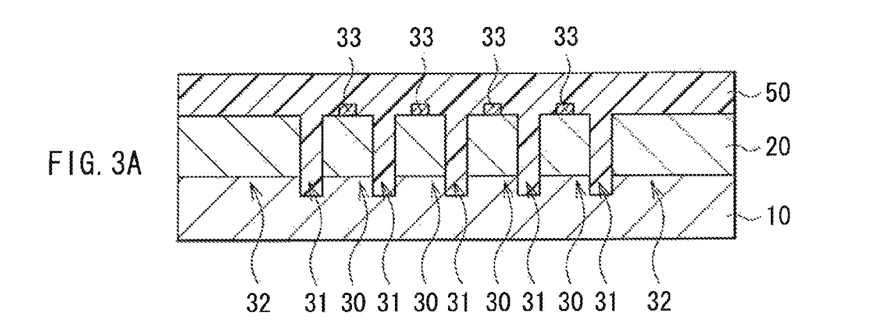
FIGS. 3A to 3C are cross sectional views for explaining an example of a method of manufacturing the laser diode of FIG. 1.
Figure 3B:
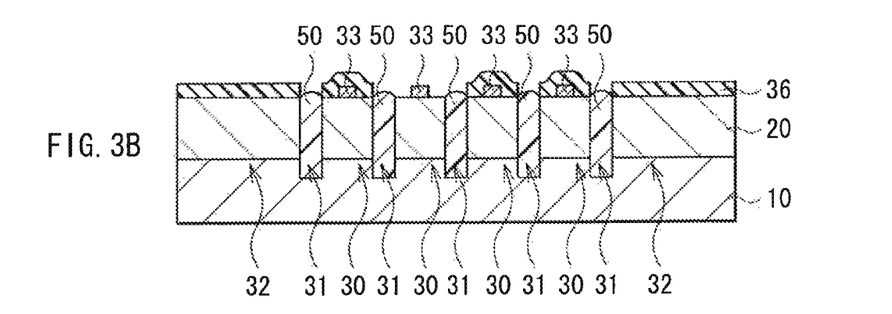
Figure 3C:
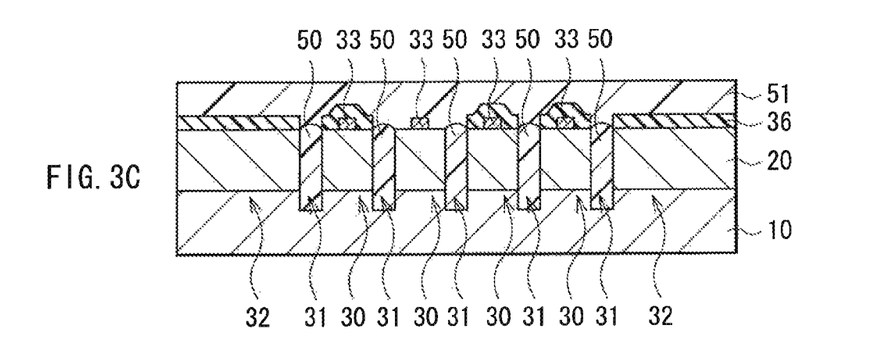

The ridge 30 includes at least the upper portion of the lower cladding layer 21, the active layer 22, the upper cladding layer 23, and the contact layer 24. In terms of electric cross talk, for example, as illustrated in FIGS. 3A to 3C, the ridge 30 preferably includes the upper portion of the substrate 10, the lower cladding layer 21, the active layer 22, the upper cladding layer 23, and the contact layer 24.

The substrate 10 is composed of, for example, p-type GaAs. Examples of p-type impurity include magnesium (Mg) and zinc (Zn). The lower cladding layer 21 is composed of, for example, p-type AlGaAs. The active layer 22 is composed of, for example, undoped AlGaAs. In the active layer 22, a strip-shaped region including a region opposed to an after-mentioned upper electrode 33 becomes a light emitting region 22A. The light emitting region 22A corresponds to a current injection region into which a current from the upper electrode 33 is injected. The upper cladding layer 23 is composed of, for example, n-type AlGaAs. The contact layer 24 is composed of, for example, n-type GaAs. Examples of n-type impurity include silicon (Si) and selenium (Se).

On the top face of the respective ridges 30 (top face of the contact layer 24), the upper electrode 33 is singly provided. For example, as illustrated in FIGS. 1A and 1B, the upper electrode 33 is in the shape of a strip extending in the extending direction of the ridge 30. The upper electrode 33 is electrically connected to the contact layer 24 and the upper cladding layer 23. Further, a plurality of pad electrodes 34 are provided in a region different from that of both the ridge 30 and the groove 31 in the semiconductor layer 20, that is, on the base 32. An insulating layer 36 is provided between the pad electrode 34 and the base 32. The pad electrode 34 is insulated and separated from the base 32 (in particular, the lower cladding layer 21). In the case where a current is hardly flown between the pad electrode 34 and the lower cladding layer 21, for example, in the case where a portion directly under the pad electrode 34 in the base 32 has high resistance, the insulating layer 36 between the pad electrode 34 and the base 32 is able to be omitted.

The respective pad electrodes 34 are connected to an after-mentioned wiring layer 35. The respective pad electrodes 34 are electrically connected to one of the respective upper electrodes 33 with one or a plurality of wiring layers 35 in between. For example, as illustrated in FIGS. 1A and 1B, the plurality of pad electrodes 34 are respectively formed in both two regions (base 32) sandwiching the ridge 30 and the groove 31 from both sides. For example, as illustrated in FIGS. 1A and 1B, the plurality of pad electrodes 34 are arranged in line in parallel with the ridge 30. Though not illustrated, the plurality of pad electrodes 34 may be arranged alternately (in a zigzag state) in the extending direction of the ridge 30. For example, as illustrated in FIGS. 1A and 1B, the pad electrodes 34 are respectively formed in a region (base 32) where a distance between a location (contact section 35A) where the upper electrode 33 is contacted with the wiring layer 35 and the pad electrode 34 becomes shortest out of two regions (base 32) sandwiching the ridge 30 and the groove 31 from both sides. The contact section 35A is provided singly for the respective wiring layers 35. The respective wiring layers 35 are electrically connected to only one upper electrode 33. For example, though not illustrated, the respective pad electrodes 34 are not necessarily formed in a base 32 where the distance between the contact section 35A and the pad electrode 34 becomes shortest out of the two bases 32. In this case, for example, though not illustrated, all the pad electrodes 34 may be formed only in one base 32. For example, as illustrated in FIGS. 1A and 1B, the pad electrode 34 may be in the shape of a rectangle. The pad electrode 34 may be in other shape. For example, though not illustrated, the pad electrode 34 may be in the shape of a circle or in the shape of an oval. For example, the pad electrode 34 may be in the shape of a polygon such as a triangle.

The insulating layer 36 is also provided on the top face of the respective ridges 30 according to needs. Specifically, the insulating layer 36 is provided in a location between a portion other than the contact section 35A in the wiring layer 35 and the top face of the ridge 30. Thereby, the respective wiring layers 35 are electrically connected to only one upper electrode 33.

The wiring layer 35 is connected to one upper electrode 33 and one pad electrode 34. The one upper electrode 33 and one pad electrode 34 are electrically connected by the wiring layer 35. The wiring layer 35 is, for example, as illustrated in FIGS. 1A and 1B, in the shape of a strip extending in a direction orthogonal to the extending direction of the ridge 30 and the groove 31. For example, the wiring layer 35 is formed by film forming method. For example, as illustrated in FIGS. 1A and 1B, the wiring layer 35 has an end in a region different from a region (contact section 35A) where the wiring layer 35 is contacted with the upper electrode 33. The wiring layer 35 extends from one base 32 to another base 32. That is, the respective wiring layers 35 are formed to stride over all the ridges 30. At this time, it is preferable that the respective wiring layers 35 are in the same shape, and have the same size.

The wiring layer 35 overjumps each groove 31, and is arranged in the air at least over the groove 31. For example, as illustrated in FIG. 1B, the portion arranged in the air in the wiring layer 35 is in the shape of an arch projecting toward opposite side of the bottom face of the groove 31, and has a structure with which possibility of being bent is decreased. For example, as illustrated in FIG. 1B, the portion not arranged in the air in the wiring layer 35 is formed being contacted with the surface of the insulating layer 36.

A lower electrode 37 is provided on the rear face of the substrate 10. The lower electrode 37 is formed, for example, on the entire rear face of the substrate 10. The lower electrode 37 is electrically connected to the substrate 10. The lower electrode 37 may be provided singly and individually for every ridge 30 as the upper electrode 33 is.

The upper electrode 33, the pad electrode 34, and the wiring layer 35 are formed by, for example, layering an alloy of gold (Au) and germanium (Ge), nickel (Ni), and gold (Au) in this order from the substrate 10 side. The upper electrode 33, the pad electrode 34, and the wiring layer 35 may be a laminated body made of a material other than the foregoing materials. Further, the upper electrode 33, the pad electrode 34, and the wiring layer 35 may be made of the same material, or may be made of a material different from each other. The insulating layer 36 is composed of, for example, SiN, $SiO_2$, SiON, $Al_2O_3$, or AlN. The lower electrode 37 is structured by layering, for example, titanium (Ti), platinum (Pt), and gold (Au) in this order from the top face side of the ridge 30.

Top face layout of the respective ridges 30

Figure 2:
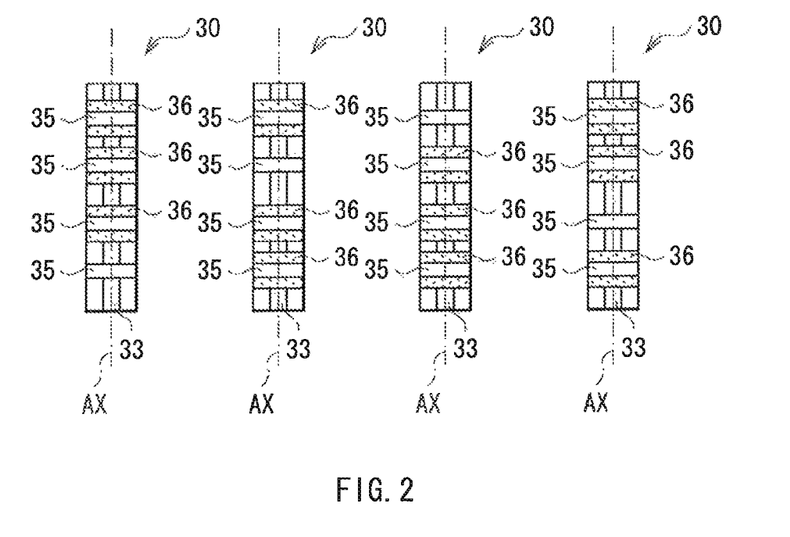
FIG. 2 is a top view of a ridge of FIG. 1.

Next, a description will be given of a top face layout of the respective ridges 30 with reference to FIG. 2. FIG. 2 illustrates an example of a top face layout of the respective ridges 30 provided in the laser diode 1. In this embodiment, the top face layout of the respective ridges 30 is symmetrical centering on a central axis AX of the ridge 30. The central axis AX is a line segment that extends in the extending direction of the ridge 30 and penetrates the center in the width direction of the ridge 30.

Specifically, the upper electrode 33 is formed, for example, on the central axis AX of the ridge 30, and is symmetrical centering on the central axis AX. Further, the portion directly above the ridge 30 in the respective wiring layers 35 (portion illustrated in FIG. 2) is also symmetrical centering on the central axis AX. The portion directly above the ridge 30 out of the insulating layer 36 (section illustrated in FIG. 2) is also preferably symmetrical centering on the central axis AX as illustrated in FIG. 2.

Figure 4:
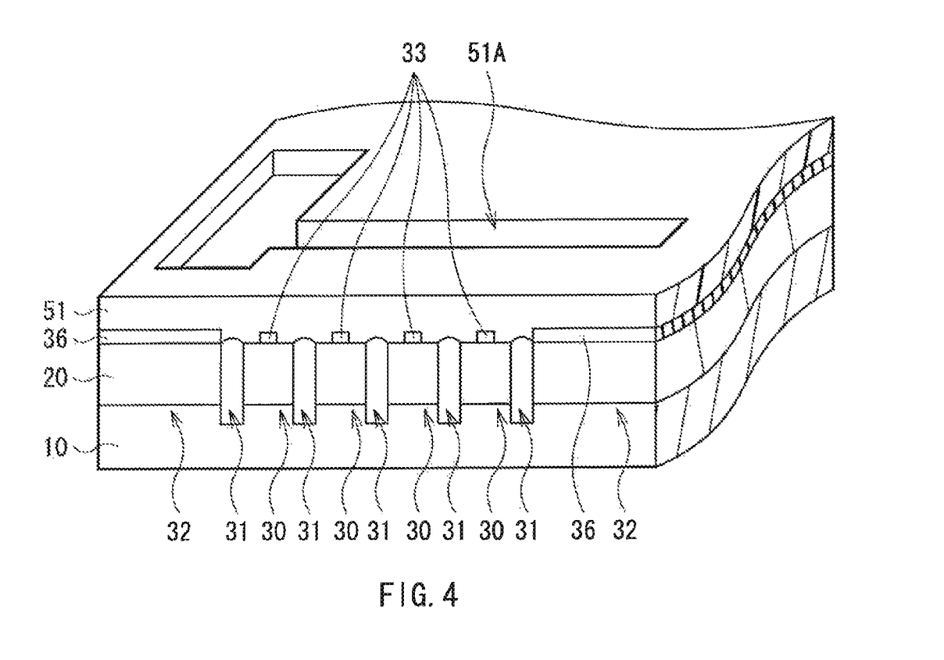
FIG. 4 is a perspective view for explaining a step following FIGS. 3A to 3C.
Figure 5A:
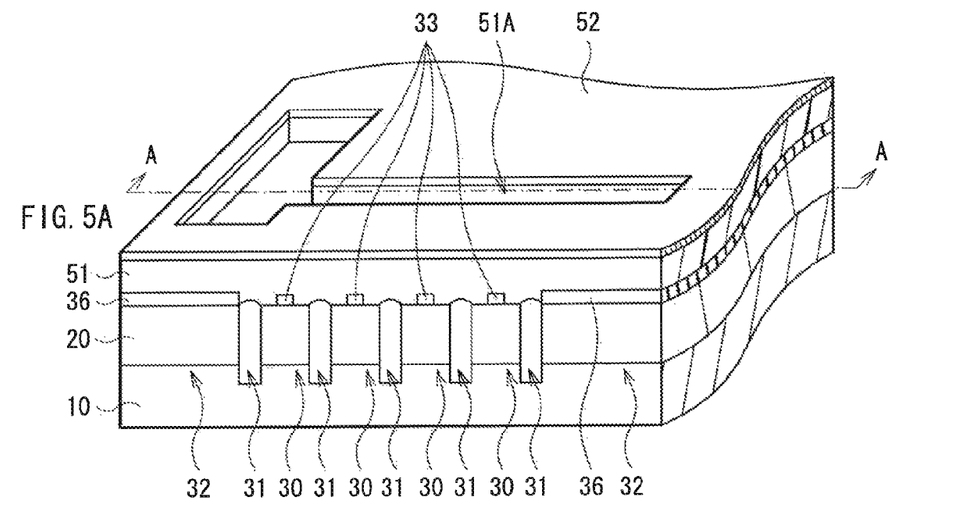
FIGS. 5A and 5B are a perspective view and a cross sectional view for explaining a step following FIG. 4.
Figure 5B:
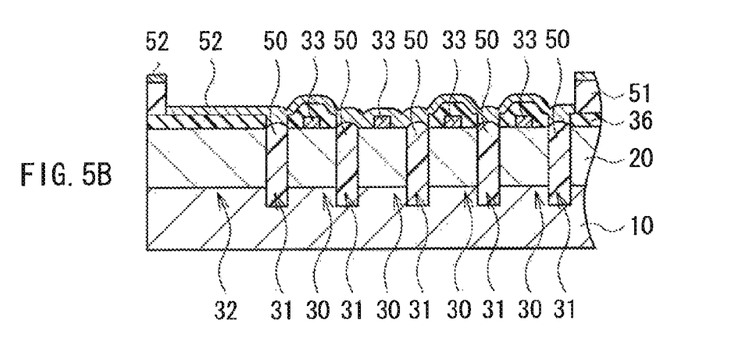

Next, a description will be given of an example of a method of manufacturing the laser diode 1 of this embodiment with reference to FIGS. 3A to 3C, FIG. 4, and FIGS. 5A and 5B. FIGS. 3A to 3C are cross sectional views in a device in the course of manufacture. FIG. 4 and FIG. 5A are perspective views of part of the device in the course of manufacture. FIG. 5B is a cross sectional structure taken along line A-A of the device illustrated in FIG. 5A.

First, the plurality of strip-shaped ridges 30 are formed to be in parallel with each other with the strip-shaped groove 31 in between on the substrate 10 (FIG. 3A). At this time, the ridge 30 and the groove 31 are formed so that the width of the groove 31 becomes smaller than the width of the ridge 30. Next, the upper electrode 33 is formed on the respective ridges 30 (FIG. 3A).

Next, a resist layer 50 is formed on the entire surface (FIG. 3B). After that, the resist layer 50 is exposed and developed so that at least inside of the groove 31 is buried and the upper electrode 33 is not covered. Thereby, the resist layer 50 remains in the groove 31. After that, the remaining resist layer 50 is hardened by a given method. Thereby, the top face of the remaining resist layer 50 becomes a curved face projecting toward the opposite side of the bottom face of the groove 31 in the lateral direction (direction crossing the extending direction of the groove 31) (FIG. 3B).

Next, a resist layer 51 is formed on the entire surface (FIG. 3C). After that, the resist layer 51 is exposed and developed, and thereby an aperture 51A is formed in a region to subsequently become the pad electrode 34 and the wiring layer 35 (FIG. 4). At this time, part of the top face of the foregoing resist layer 50 is exposed on the bottom face of the aperture 51A. Next, a metal layer 52 is formed on the entire surface by using, for example, evaporation or the like (FIGS. 5A and 5B). As described above, according to needs, part of the metal layer 52 is formed on the surface of the remaining resist layer 50. Thereby, the portion formed on the surface of the remaining resist layer 50 in the metal layer 52 becomes in the shape of an arch.

Next, for example, the resist layer 51 and an extra portion of the metal layer 52 are removed by liftoff or the like. Thereby, the pad electrode 34 and the wiring layer 35 are formed. Further, the remaining resist layer 50 is removed by a given method. In the result, the wiring layer 35 becomes in the shape of an arch and is formed in the air at least above the groove 31. Accordingly, the laser diode 1 of this embodiment is manufactured.

Next, a description will be given of operation and effect of the laser diode 1 of this embodiment.

In the laser diode 1 of this embodiment, in the case where a given voltage is applied to between the upper electrode 33 and the lower electrode 37, a current is injected into the current injection region (light emitting region 22A) of the active layer 22, and thereby light emission is generated due to electron-hole recombination. The light is reflected by the pair of the front end face S1 and the rear end face S2, laser oscillation with a given wavelength is generated, and the light is emitted outside from the front end face S1 of the respective ridges 30 as a laser beam.

In this embodiment, the groove 31 is provided between adjacent ridges 30. Further, the wiring layer 35 that electrically connects the upper electrode 33 and the pad electrode 34 is arranged in the air at least above the groove 31. That is, in this embodiment, a filler such as an insulating material is not provided in a gap between the wiring layer 35 and the internal wall of the groove 31. Thus, there is no possibility that a stress is generated in the ridge 30 differently from the case that, for example, the filler such as the insulating material is provided in the gap between the wiring layer 35 and the internal wall of the groove 31. Therefore, rotation of a polarization angle caused by the stress applied to the ridge 30 is able to be suppressed.

The laser diode 1 of this embodiment is a narrow pitch type laser having a beam pitch of about several tens of μm. Thus, it is significantly difficult to form the wiring layer 35 by wire bonding. If the wiring layer 35 is tried to be formed by wire bonding, there is a high possibility that one wire ball is contacted with the plurality of upper electrodes 33, and the respective ridges 30 are not able to be independently driven. Further, since ultrasonic bonding is used in wire bonding, there is a possibility that lowering of reliability caused by ultrasonic wave is generated. Thus, in this embodiment, the wiring layer 35 is formed by film forming method. Thereby, the wiring layers 35 are prevented from being contacted with each other, and incapability of independently driving the respective ridges 30 is prevented. Further, lowering of reliability caused by ultrasonic wave is prevented from being generated.

Further, in this embodiment, in the case where the wiring layer 35 is in the shape of an arch at least above the groove 31, there is no possibility that the wiring layer 35 is bent. In the result, reliability is able to be further improved. As a method of obtaining the arch shape of the wiring layer 35, as described above, the two stage exposure in which the exposed and developed resist layer 50 is left in the groove 31 first, and the wiring layer 35 is formed with the use of the remaining resist layer as a base is preferably used. By using the two stage exposure, the wiring layer 35 is surely able to be formed in the shape of an arch at lest above the groove 31, and high reliability is able to be obtained.

Further, in this embodiment, the respective wiring layers 35 have the end in the region different from the region (contact section 35A) where the wiring layer 35 is contacted with the upper electrode 33. Thereby, compared to a case that the respective wiring layers 35 have an end in the contact section 35A, symmetry centering on the central axis AX of the ridge 30 of the shape of the region opposed to the top face of the ridge 30 in the wiring layer 35 is high. In the result, there is no possibility that a stress is applied asymmetrically to the ridge 30 with respect to the central axis AX caused by asymmetry of the structure (in particular, the wiring layer 35) formed on the top face of the respective ridges 30. Thus, rotation of a polarization angle caused by the stress applied to the ridge 30 is able to be suppressed. Accordingly, polarization directions of light emitted from the plurality of ridges 30 are able to be aligned.

In particular, in this embodiment, the groove 31 is provided on both sides of the ridge 30. Further, the groove 31 is not buried but is in a state of an air gap. Thus, asymmetry of the respective wiring layers 35 become a main factor of polarization direction change. Thus, by increasing symmetry of the respective wiring layers 35, aligning the polarization directions of light emitted from the plurality of ridges 30 are able to be realized easily.

MODIFIED EXAMPLES

In the foregoing embodiment, the description has been given of the case that the wiring layer 35 extends from one base 32 to another base 32. However, for example, the wiring layer 35 may have the end in the vicinity of the connection section 35A. In this case, for example, as illustrated in FIGS. 6A, 6B, 7A, and 7B, the end of the wiring layer 35 may be provided in the end of the top face of the ridge 30 or in the vicinity thereof. Further, for example, though not illustrated, it is possible that the wiring layer 35 hurdles the upper electrode 33 contacted with the wiring layer 35, and the end of the wiring layer 35 is provided in the vicinity of a side face of the upper electrode 33. Further, in the case where the end of the wiring layer 35 is provided in the end of the top face of the ridge 30 or in the vicinity thereof, or is provided in the vicinity of a side face of the upper electrode 33, for example, as illustrated in FIGS. 6A and 6B, a dummy wiring layer 35B not functioning as a wiring layer may be provided on the ridge 30. The dummy wiring layer 35B is provided in order to equalize the number of wiring layers on the respective ridges 30. In this case, it is able to inhibit change of polarization angle caused by difference of the number of wiring layers on the ridges 30.

Further, in the foregoing embodiment and the foregoing modified examples, the wiring layer 35 is arranged in the air at least above the groove 31. However, the wiring layer 35 is not necessarily arranged in the air. For example, as illustrated in FIG. 8, it is possible that the groove 31 is buried with a buried layer 38, and the wiring layer 35 is provided being contacted with the buried layer 38. The buried layer 38 is preferably made of a material with which a stress generated in the ridge 30 is small. Further, for example, as illustrated in FIG. 9, it is possible that instead of the groove 31, a high resistance region 39 is formed by injecting ions into the semiconductor layer 20, and the wiring layer 35 is provided being contacted with the high resistance region 39. However, in this case, the laser oscillation region is integral with the high resistance region 39. Thus, a laser structure 40 having the same internal structure as the internal structure of the ridge 30 is formed between adjacent high resistance regions 39.

Further, in the foregoing embodiment and the foregoing modified examples, the plurality of ridges 30 are provided in the semiconductor layer 20. However, for example, as illustrated in FIGS. 10A and 10B, the single ridge 30 may be provided. At this time, both sides of the ridge 30 are preferably an air gap, or may be buried with some material.

While descriptions have been hereinbefore given of the invention with reference to the embodiment and the modified examples thereof, the invention is not limited to the foregoing embodiment and the like, and various modifications may be made.

For example, in the foregoing embodiment and the like, the description has been given of the case that the number of the wiring layers 35 that connects one upper electrode 33 and one pad electrode 34 is only one, but may be two.

Further, in the foregoing embodiment and the like, the invention has been explained taking the AlGaAs-based compound laser diode as an example. However, the invention is applicable to other compound laser diode, for example, a red laser diode such as an AlGaInP-based red laser diode and a GaInAsP-based red laser diode; a gallium nitride laser diode such as a GaInN-based laser diode and an AlGaInN-based laser diode; and a Group II-VI laser diode such as a ZnCd-MgSSeTe laser diode. Further, the invention is applicable to a laser diode in which the oscillation wavelength is not limited to the visible range such as an AlGaAs-based laser diode, an InGaAs-based laser diode, an InP-based laser diode, and a GaInAsNP-based laser diode.

The present application contains subject matter related to that disclosed in Japanese Priority Patent Application JP 2009-155737 filed in the Japan Patent Office on Jun. 30, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof

What is claimed is:

1. A laser diode comprising:
   a substrate;
   a plurality of strip-shaped laser structures arranged in parallel with respect to each other, each including a lower cladding layer, an active layer, and an upper cladding layer in this order on the substrate;
   grooves between the strip-shaped laser structures, the grooves extending into the substrate;
   a plurality of strip-shaped upper electrodes respectively formed on top faces of the laser structures, each electrode being electrically connected to the respective upper cladding layer;
   a plurality of wiring layers extending in a direction across the plurality of strip-shaped laser structures, each wiring layer electrically connected to a respective upper electrode;
   first and second pad electrode regions between which are located the strip-shaped laser structures and the grooves, each pad electrode region having a groove adjacent thereto; and
   a plurality of pad electrodes formed in the pad electrode regions, each pad electrode electrically connected to a respective upper electrode via a respective wiring layer such that the wiring layers alternately extend from a respective pad electrode in one pad electrode region to the other pad electrode region where it is not connected to a pad electrode,
   wherein,
   the grooves are effective to eliminate electrical crosstalk between adjacent laser structures,
   each wiring layer has an end in a region different from a region where the respective wiring layer is connected with its respective upper electrode, and
   the end of each wiring layer extends across the groove adjacent the other pad electrode region.

2. The laser diode according to claim 1, wherein a portion directly above a laser structure in the respectively connected wiring layer is symmetrical about a central axis of the laser structure.

3. The laser diode according to claim 2, wherein some wiring layers extend over more than one laser structure.

4. The laser diode according to claim 1, wherein a top face layout of the laser structure is symmetrical about a central axis of the laser structure.

5. The laser diode according to claim 1 wherein the respective wiring layers are arranged in the air at least above the grooves.

6. The laser diode according to claim 1 comprising: respective buried layers filling the grooves,
   wherein,
   the respective wiring layers are formed being contacted with the buried layer above the groove.

7. The laser diode according to claim 1 comprising a high resistance material filling the grooves separating the laser structures, wherein, the wiring layers are in contact with the high resistance material.

* * * * *